US012575047B2

(12) United States Patent
Pfeifer et al.

(10) Patent No.: US 12,575,047 B2
(45) Date of Patent: Mar. 10, 2026

(54) PROCESS FOR REVERSIBLY CONNECTING A SENSOR TO AN INLET

(71) Applicant: Endress+Hauser Conducta GmbH+Co. KG, Gerlingen (DE)

(72) Inventors: André Pfeifer, Schkopau (DE); Christian Fanselow, Geringswalde (DE); Damian Mayerhofer, Dresden (DE); Thomas Nagel, Dresden (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 534 days.

(21) Appl. No.: 18/158,110

(22) Filed: Jan. 23, 2023

(65) Prior Publication Data

US 2023/0164941 A1     May 25, 2023

Related U.S. Application Data

(62) Division of application No. 16/668,936, filed on Oct. 30, 2019, now Pat. No. 11,589,473.

(30) Foreign Application Priority Data

Oct. 30, 2018    (DE) ...................... 10 2018 127 014.3

(51) Int. Cl.
| | |
|---|---|
| *H05K 5/06* | (2006.01) |
| *H01R 13/52* | (2006.01) |
| *H01R 13/58* | (2006.01) |

(52) U.S. Cl.
CPC ......... *H05K 5/069* (2013.01); *H01R 13/5205* (2013.01); *H01R 13/5804* (2013.01); *H05K 5/068* (2013.01)

(58) Field of Classification Search
CPC .... H05K 5/069; H05K 5/068; H01R 13/5205; H01R 13/5804
See application file for complete search history.

(56) References Cited

U.S. PATENT DOCUMENTS

| | | | | | |
|---|---|---|---|---|---|
| 3,797,235 | A | * | 3/1974 | Eheim | ....................... F02C 9/38 |
| | | | | | 415/10 |
| 4,538,465 | A | * | 9/1985 | Bianchi | ................... G01L 9/007 |
| | | | | | 340/870.31 |

(Continued)

FOREIGN PATENT DOCUMENTS

| | | | | |
|---|---|---|---|---|
| EP | 2330408 | B1 * | 1/2013 | ......... G01N 27/4078 |

*Primary Examiner* — Jeffrey T Carley
*Assistant Examiner* — Jose K Abraham
(74) *Attorney, Agent, or Firm* — Christopher R. Powers; Endress+Hauser (USA) Holding, Inc.

(57) ABSTRACT

The present disclosure relates to a process connection for connecting a sensor to a process inlet via a process seal and a fixing element. The process connection includes a sensor housing and a clamping element. The sensor housing has a housing body configured to receive the sensor and a housing collar that extends around the housing body and has a first sealing section, which encircles the housing body, and a contact area. The housing collar is formed integrally with the housing body. The first sealing section is suitable for receiving the process seal to connect the process inlet to the housing collar in a fluid-tight manner. The clamping element has a contact area which is suitable for coming into contact with the contact area of the housing collar to press the housing collar onto the process seal.

15 Claims, 4 Drawing Sheets

(56)                    References Cited

U.S. PATENT DOCUMENTS

| | | | | |
|---|---|---|---|---|
| 4,640,135 | A * | 2/1987 | Kastel | G01L 19/0645 92/81 |
| 5,043,841 | A * | 8/1991 | Bishop | G01L 9/0075 361/283.4 |
| 6,711,033 | B2 * | 3/2004 | Weiblen | H05K 5/061 361/752 |
| 7,240,558 | B2 * | 7/2007 | Ernsberger | G01L 19/148 73/725 |
| 2005/0056097 | A1 * | 3/2005 | Banholzer | G01L 19/148 73/700 |
| 2005/0072672 | A1 * | 4/2005 | Hoorn | H01L 24/73 204/435 |
| 2005/0132813 | A1 * | 6/2005 | Aratani | G01L 19/0645 73/715 |
| 2006/0164203 | A1 * | 7/2006 | Mast | G01L 19/0038 338/68 |
| 2008/0132104 | A1 * | 6/2008 | Iwase | G01D 11/245 439/279 |
| 2012/0260733 | A1 * | 10/2012 | Elliott | G01N 27/4078 73/431 |
| 2017/0176372 | A1 * | 6/2017 | Hanko | C12Y 101/03004 |
| 2018/0132444 | A1 * | 5/2018 | Balkenhol | F16L 29/007 |

* cited by examiner

PROCESS FOR REVERSIBLY CONNECTING A SENSOR TO AN INLET

CROSS-REFERENCE TO RELATED APPLICATION

The present application is related to and claims the priority benefit of German Patent Application No. 10 2018 127 014.3, filed on Oct. 30, 2018, and U.S. patent application Ser. No. 16/668,936, filed Oct. 30, 2019, the entire contents of which are incorporated herein by reference.

TECHNICAL FIELD

The present disclosure relates to a process connection for a sensor and to a manufacturing method for such a process connection.

BACKGROUND

Process connections for sensors are used in a wide variety of industrial processes. Process connections serve to bring various kinds of sensors, for example a conductivity sensor, into contact with the process medium of the process. The device carrying the process, for example a pipe or other container, has a process inlet for this purpose. The process inlet and the process connection must be connected to each other in a leakproof and disconnectable manner. In order to achieve a leakproof closure of the process inlet, a process seal is installed between the process connection and the process inlet. In addition, a fixing element is used, for example a clamp, a screw or a union nut, in order to connect the process connection to the process inlet in a disconnectable manner. The fixing element presses the process connection onto the process seal in order to prevent the process medium from escaping. The disconnectable connection of process inlet and process connection makes maintenance of the process connection or of the sensor possible.

Certain properties of the process connection and of the process inlet are subject to various requirements, depending on the field of application, which are defined by national and international standards (such as, for example, DIN 11851, DIN 11864-1, ISO 2852, etc.) or industry quasi-standards of the application sectors (for example, "Varivent," "Biocontrol," etc.). Particularly in processes of the food and beverage industry, there are strict regulations regarding the hygiene of process connections.

The hygienic properties of process connections are mainly affected by any gaps, edges or seals present, since deposits can easily form there. There are hygienic process connections which have, for example, few seals, but which in turn only fit precisely one process inlet having a particular diameter. However, since there is a multiplicity of process inlets each having different inlet diameters, the cost of realizing a variety of process connections for a sensor family is very high.

SUMMARY

An object of the present disclosure is to provide a process connection for a sensor which can deliver excellent hygienic properties and be usable for a plurality of process inlets in an economical manner.

This object is achieved by claim 1.

The present disclosure relates to a process connection for a sensor. The process connection is suitable for being connected to a process inlet via a process seal and a fixing element. The process connection includes a sensor housing and a clamping element. The sensor housing has a housing body and a housing collar. The housing body is designed to receive the sensor. The housing collar extends around the housing body and has a first sealing section encircling the housing body and also has a contact area. The housing collar is formed integrally with the housing body. The first sealing section is suitable for receiving the process seal in order to connect the process inlet to the housing collar in a fluid-tight manner. The clamping element has a contact area which is suitable for coming into contact with the contact area of the housing collar in order to press the housing collar onto the process seal.

The process connection according to the present disclosure offers many advantages, wherein only a few advantages are to be mentioned below as examples. One advantage which arises from the single-piece design of the sensor housing, especially, of the housing body and of the housing collar, is that additional sealing points are avoided. On the one hand, there are thus fewer gaps in which deposits could form, which has an advantageous effect on the hygienic properties of the sensor housing, and on the other hand, there are fewer elements to be maintained in the process connection. The advantage of a separate clamping element is that the clamping element can be used to receive the contact forces of the fixing element and transfer them to the sensor housing. The housing collar can thus be optimized for the particular manufacturing method and adapted to the respective diameters of the process inlets. Thanks to the process connection according to the present disclosure, it is thus possible to achieve flexible production and at the same time a reliable sealing effect.

According to one embodiment, the clamping element is annular and has an axially circumferential first sealing section which is suitable for contacting the process seal in order to connect the process inlet to the clamping element in a fluid-tight manner.

According to one embodiment, the process connection comprises an annular sealing element which is arranged between the sensor housing and the clamping element.

According to one embodiment, the annular sealing element is arranged between the housing body of the sensor housing and the clamping element.

According to one embodiment, the first sealing section of the housing collar is arranged on one end face at a radially outer end of the annular housing collar.

According to one embodiment, the first sealing section has one of the following cross-sectional shapes: flat, conical or groove-shaped, especially, semicircular or rectangular.

According to one embodiment, the sensor housing has a transition region which is arranged between the housing collar and the housing body and has a radius between 3.2 mm and 6 mm or greater than 6 mm.

The present disclosure also relates to a manufacturing method for the process connection according to the present disclosure as claimed in claim 8.

For a prespecified process inlet and for a prespecified process seal, the manufacturing method according to the present disclosure for the process connection according to the present disclosure comprises the following steps: fabricating the sensor housing so that the housing body and the housing collar are integrally formed; adapting the housing collar so that the housing collar has an outer diameter as well as a first sealing section which are suitable for the prespecified process inlet and process seal; and fabricating the clamping element.

The manufacturing method according to the present disclosure has the advantage that the sensor housing can be manufactured in a material-saving manner. A high-quality material can thus be used for the sensor housing without the production costs thereof being excessively burdened. By adapting the housing collar to the outer diameter of the process inlet, it is possible to adapt the sensor housing to any outer diameter of a process inlet.

According to one embodiment, the sensor housing is manufactured by injection molding.

According to one embodiment, the adaptation step of the housing collar is carried out by a separating method, for example a machining method.

BRIEF DESCRIPTION OF THE DRAWINGS

The present disclosure is explained in more detail on the basis of the following description of the figures in which.

DETAILED DESCRIPTION

Figure 1:
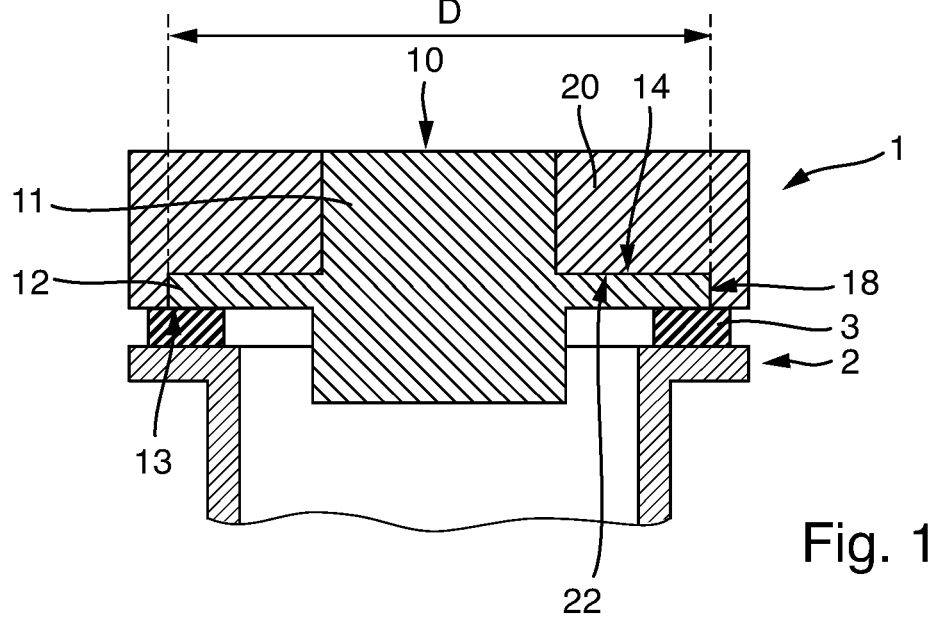
FIG. 1 shows a cross-sectional view of a process connection according to the present disclosure connected via a sealing ring to a process connection.

FIG. 1 shows a process connection 1 for a sensor. The process connection 1 includes a sensor housing 10 and a clamping element 20. The process connection 1 is configured for being connected to a process inlet 2 via a process seal 3 and a fixing element 4 (shown in FIGS. 2 and 3).

The sensor housing 10 has a housing body 11 and a housing collar 12. The housing body 11 is designed to receive the sensor. The housing body 11 enables the sensor to analyze a process medium through the process inlet 2. If the sensor is, for example, an inductive conductivity sensor, the measuring coils of the inductive conductivity sensor are enclosed by the housing body 11 and can thus be immersed into the process medium, for example, a liquid. In the case of an optical sensor, the housing body 11 enables the sensor, for example, to have only optical access to the process medium.

The housing collar 12 extends around the housing body 11 as shown in FIGS. 1-7. The housing collar 12 has a first sealing section 13 at a periphery of the housing body 11. The first sealing section 13 is configured for receiving the process seal 3 to connect the process inlet 2 to the housing collar 12 in a fluid-tight manner (e.g., liquid-tight or airtight). The housing collar 12 is designed in such a way that the first sealing section 13 seats on the process seal 3 when the process connection is fastened to the process inlet 2.

The housing collar 12 extends from the housing body 11. In one embodiment, the housing collar 12 has a thickness between 2 mm and 3.1 mm. This makes it possible to save material on the sensor housing 10. The material thickness of the housing collar 11 is selected depending on the preferred manufacturing method to achieve a desired quality and/or a desired cost saving.

The housing collar 12 has a contact area 14. The contact area 14 is configured for experiencing a contact force so that the sensor housing 10 is pressed onto the process seal 3.

The housing collar 12 is formed integrally with the housing body 11. Sealing points in addition to the process seal 3 are thus not needed.

The clamping element 20 of the process connection 1 has a contact area 22, as shown in FIG. 1. The contact area 22 is configured for contacting the contact area 14 of the housing collar 12 in order to press the housing collar 12 onto the process seal 3.

Figure 3:
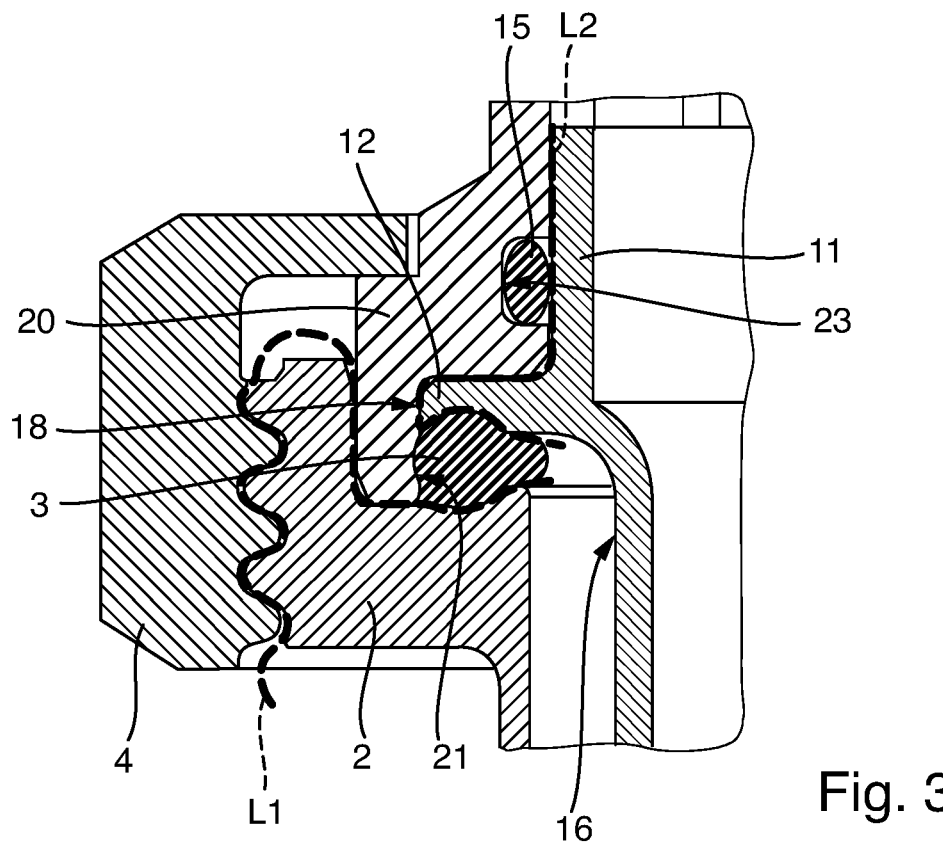
FIG. 3 shows a detail view of FIG. 2.

As shown in FIG. 3, the clamping element 20 is partially enclosed by two potential leakage paths L1, L2. The first leakage path L1 is harmless for a sensor arranged in the process connection 1 since the leakage path L1 cannot penetrate into the interior of the process connection 1. The second leakage path L2 is potentially harmful for a sensor arranged in the process connection 1 since the second leakage path L2 does penetrate into the interior of the process connection 1.

The clamping element 20 is annular in that the clamping element 20 forms a closed ring. The radial cross-section of the annular clamping element 20 can take any form.

The clamping element 20 has an axially circumferential first sealing section 21 and an axially circumferential second sealing section 23 (see FIG. 3).

The first sealing section 21 is configured for contacting the process seal 3 in order to connect the process inlet 1 to the clamping element 20 in a fluid-tight manner. Due to the circumferential first sealing section 21 of the clamping element 20, the clamping element 20 also comes into contact with the process seal 3 in addition to the sensor housing 10 and thus forms a further sealing point between the interior and exterior of the process seal 3 so that a sealing effect between the housing collar 12 and the clamping element 20 is achieved only with the already required process seal 3.

In an alternative embodiment (see FIG. 7), the clamping element 20 does not touch the process seal 3.

The second sealing section 23 is configured for contacting an annular sealing element 15. The annular sealing element 15 is disposed between the sensor housing 10 and the second sealing section 23 of the clamping element 20 (see FIGS. 2-4). The potential second leakage path L2 of the process medium between the clamping element 20 and the sensor housing 10 is thus sealed. The process medium thus cannot penetrate into the interior of the sensor housing 10 when the process seal 3 fails.

In one embodiment (not shown), the clamping element 20 has a leakage hole. The leakage hole is arranged between the first sealing section 21 and the second sealing section 23 of the clamping element in such a way that a process medium flowing along the second leakage path L2 is at least partially discharged through the leakage hole. The leakage hole is configured for making visible to a user the discharge of the process medium along the potential second leakage path L2.

Figure 2:
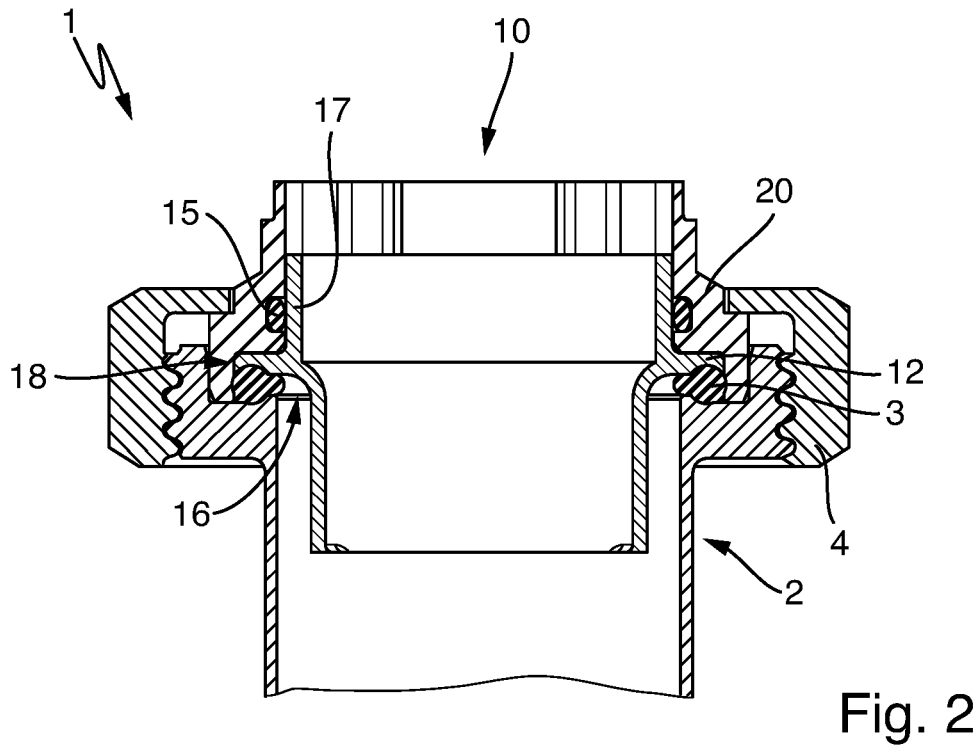
FIG. 2 shows a cross-sectional view of an embodiment of the process connection shown in FIG. 1.
Figure 4:
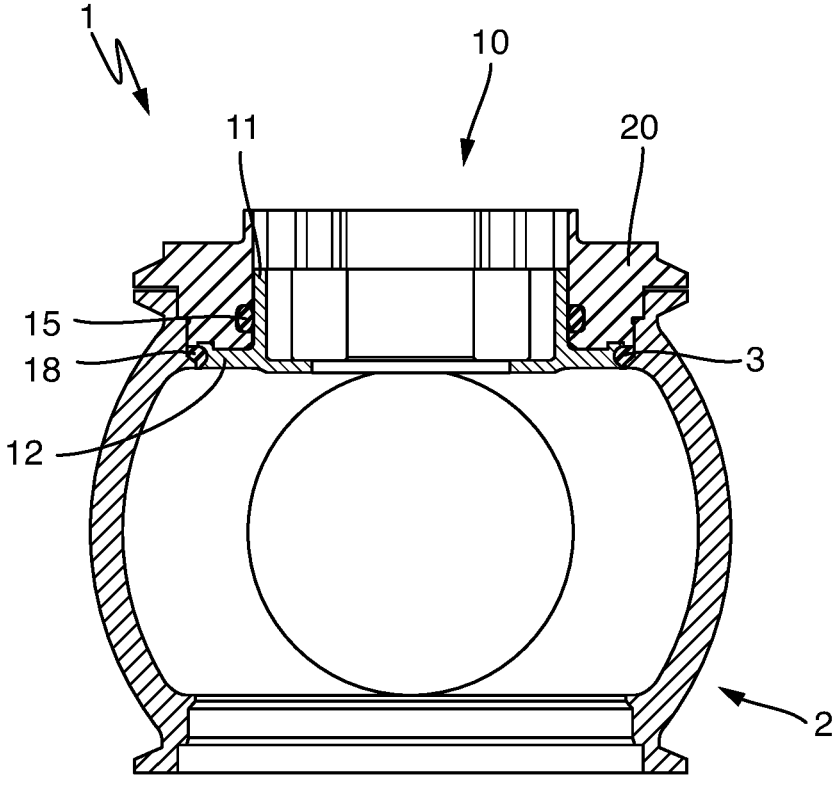
FIG. 4 shows a cross-sectional view of an alternative embodiment of a process connection.

The annular sealing element 15 is arranged, for example, between the clamping element 20 and the housing body 11, as shown in FIGS. 2-4. The annular sealing element 15 may have various cross-sectional shapes. For example, the annular sealing element 15 may be an O-ring seal. The clamping element 20 is designed to precisely fit the housing body 11. The sensor housing 10 has a second sealing section 17 disposed on the housing body 11 in order to come into contact with the sealing element 15. The sealing element 15 may be, for example, an elastomer seal.

Alternatively, the sealing element 15, the second sealing section 23 of the clamping element 20, and the second sealing section 17 of the sensor housing 10 can be arranged such that the sealing point formed by the sealing element 15 is formed between the clamping element 20 and the housing collar 12 of the sensor housing 10 (not shown).

As shown in FIG. 4, in an alternative embodiment of the process connection 1, the first sealing section 13 of the housing collar 12 is arranged on an end face 18 of the housing collar 12. The end face 18 of the housing collar 12 is located at a radially outer end of the annular housing collar 12.

The first sealing section 13 of the housing collar 12 may have various cross-sectional shapes. For example, the first sealing section 13 may be flat or may be a groove (e.g., semicircular or rectangular). The process connection 1 is thus suitable, for example, for process inlets 2 that satisfy the requirements of SMS 1147, DIN 11851 or ISO 2852.

The sensor housing 10 has a transition region 16 which is arranged between the housing collar 12 and the housing body 11 and has a radius between 3.2 mm and 6 mm or greater than 6 mm, which can be seen particularly well in FIG. 3. Alternatively, the transition region 16 has a radius greater than 6 mm. This allows the process connection 1 to be less susceptible to deposits of the process medium. The hygienic properties of the process connection 1 are thereby improved.

The manufacturing method of the above-described process connection 1 according to the present disclosure is now described below.

In a first step, the sensor housing 10 is manufactured. During this manufacturing step, the housing body 11 and the housing collar 12 are integrally formed. Manufacturing the housing body 11 and the housing collar 12 as a single piece prevents gap formations at the process connection and avoids additional sealing points.

The sensor housing 10 can be manufactured in such a way that the housing collar 12 has an outer diameter D (as shown in FIG. 1) such that the sensor housing 10 is larger than the largest process inlet 2 of a category of process inlets. Only a single "standard contour" of the sensor housing 10 thus needs to be manufactured for a plurality of process inlets, which reduces manufacturing costs and non-productive times.

The sensor housing 10 may be manufactured by a primary forming method (e.g., casting), a forming method (e.g., pressure forming), a cutting method (e.g., machining), or combinations of the aforementioned methods.

In order to manufacture the sensor housing 10, for example, a material may be selected from one of the following materials: thermoplastics, thermosets, polyether ether ketones, thermoplastic polyether ether ketones, metal, ceramic or glass.

The sensor housing 10 is manufactured by an injection molding method, for example. This has the advantage that identical parts can be manufactured cost-effectively in large numbers and closed sensor housings can be produced in a hygienic design with a high degree of freedom of shape. Furthermore, a closed, seal-free surface can thus be realized with a high degree of freedom of design.

In a next step, the housing collar 12 is adapted in such a way that the housing collar 12 has an outer diameter D, which is configured for a prespecified process inlet 2. This makes it possible to adapt the standard type of sensor housing to a particular process inlet 2 in order to achieve the maximum precision for the process connection 1. If the housing collar 12 is to be adapted to the largest process inlet 2 of a category of process inlets, the adaptation step serves to achieve a higher accuracy of fit for the process inlet.

Figure 5:
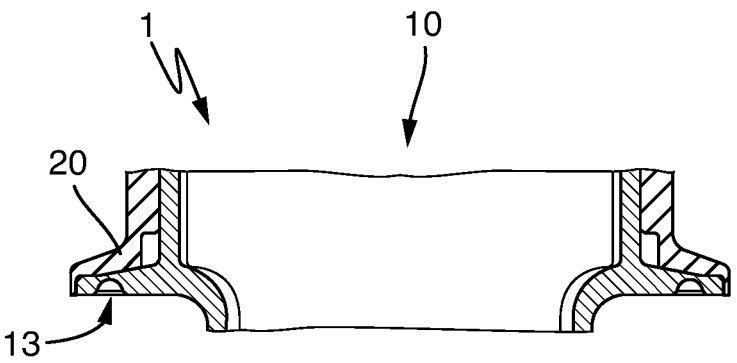
FIG. 5 shows a cross-sectional view of an alternative embodiment of the process connection shown in FIG. 2.
Figure 6:
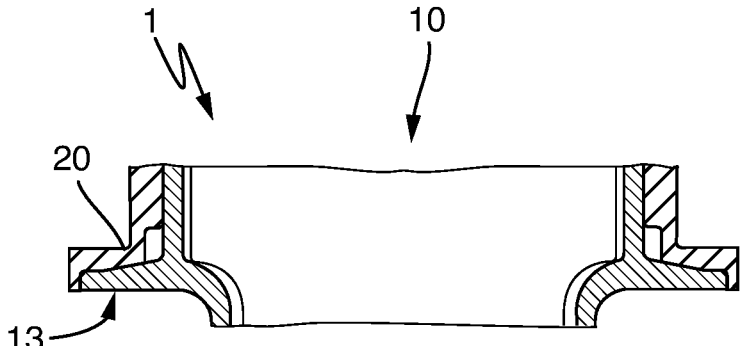
FIG. 6 shows a cross-sectional view of an alternative embodiment of the process connection shown in FIG. 2.
Figure 7:
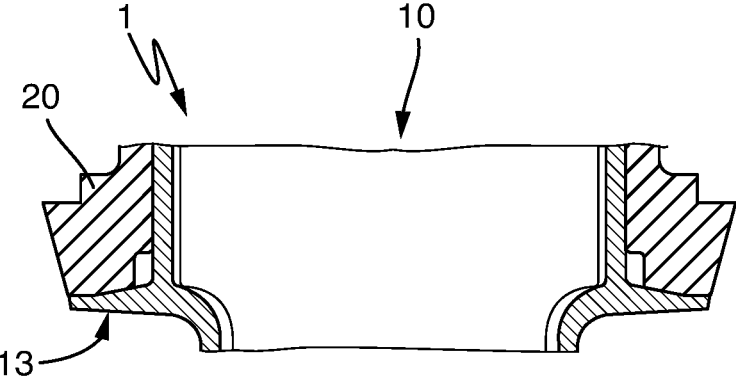
FIG. 7 shows a cross-sectional view of an alternative embodiment of the process connection shown in FIG. 2.

As shown in FIGS. 5-7, the adaptation step of the housing collar 12 also comprises the adaptation of the first sealing section 13 of the sensor housing 10 so that the sealing section 13 is configured for receiving a particular process seal 3. The sealing section 13 is, for example, flat, conical or groove-shaped, semicircular or rectangular.

For example, during the adaptation step, the first sealing section 13 may be formed such that a molded seal in accordance with ISO 2852 may be received by the first sealing section 13 (see FIG. 5).

For example, during the adaptation step, the first sealing section 13 may be formed such that a flat ring seal in accordance with SMS 1147 may be received by the first sealing section 13 (see FIG. 6).

As a further example, during the adaptation step, the first sealing section 13 may be formed such that a D-ring seal in accordance with DIN 11851 may be received by the first sealing section 13 (see FIG. 7).

The adaptation step of the housing collar 12 takes place, for example, by machining the housing collar 12. This has the advantage of a high degree of flexibility in material and geometry coupled with a higher precision.

In a further step, the clamping element 20 is manufactured. The clamping element 20 is manufactured in such a way that it is configured for the sensor housing 10 for the particular process inlet 2.

The clamping element 20 may be manufactured by a primary forming method (e.g., casting), a forming method (e.g., pressure forming), a cutting method (e.g., machining), or combinations of the aforementioned methods. The manufacturing method for the clamping element 20 can also be selected depending on the manufacturing method selected for the sensor housing 10.

For manufacturing the clamping element 20, a material is, for example, selected from one of the following materials: thermoplastics, thermosets, polyether ether ketones, thermoplastic polyether ether ketones, metal, ceramic or glass.

The clamping element 20 is fabricated, for example, by a machining process. This has the advantage that a flexible, requirement-appropriate selection of the material of the clamping element 20 and a high precision in the manufacture of the clamping element 20 are achieved at a favorable cost.

The invention claimed is:

1. A manufacturing method for a process connection adapted for reversibly connecting a sensor to a prespecified process inlet, which includes a fixing element and a process seal, the manufacturing method comprising:

fabricating a sensor housing, which includes a housing body and a housing collar formed integrally in one piece, wherein the housing body is fabricated to receive the sensor and such that the housing collar extends outwardly from a periphery of the housing body, wherein the housing collar has an outer diameter, includes a first sealing section surrounding the housing body, and includes a collar contact area;

after fabricating the sensor housing, adapting the housing collar such that the housing collar and the first sealing section are conformed complementary to the prespecified process inlet, including the fixing element and the process seal; and fabricating a clamping element complementary to the fixing element of the process inlet, including a clamping contact area configured to seat against the collar contact area of the housing collar as to, in assembly, press the housing collar against the process seal of the process inlet such that, under load from the fixing element, the sensor housing connects to the process inlet via the housing collar in a reversible, fluid-tight manner.

2. The manufacturing method claim 1, wherein the sensor housing is fabricated by injection molding.

3. The manufacturing method claim 1, wherein the clamping element is fabricated by casting, machining or a combination thereof.

4. The manufacturing method claim 1, wherein the sensor housing is fabricated of a material comprising a thermoplastic, a thermoset, a metal, a ceramic or a glass.

5. The manufacturing method claim 4, wherein the sensor housing is fabricated of a material comprising polyether ether ketone.

6. The manufacturing method claim 1, wherein the adapting of the housing collar is performed using a separating method.

7. The manufacturing method claim 6, wherein the adapting of the housing collar is performed using a machining method.

8. The manufacturing method claim 1, wherein the adapting of the housing collar includes reducing the outer diameter.

9. The manufacturing method claim 1, wherein the adapting of the housing collar includes adapting the first sealing section to be complementary to the process seal, wherein the process seal is configured to an industry standard, wherein in the industry standard is one of ISO 2852, DIN 11851 and SMS 1147.

10. The manufacturing method claim 1, wherein the clamping element is annular, having an axially circumferential clamp sealing section configured to contact the process seal as to connect the clamping element to the process inlet in a fluid-tight manner.

11. The manufacturing method claim 1, wherein the sensor housing is fabricated such that the first sealing section of the housing collar is disposed on an end face at a radially outer end of the housing collar.

12. The manufacturing method claim 1, wherein the sensor housing is fabricated such that the first sealing section has a flat, conical, groove, semicircular or rectangular cross-sectional shape.

13. The manufacturing method claim 1, wherein the sensor housing is fabricated such that the sensor housing includes a transition region disposed between the housing collar and the housing body, the transition region having a radius of between 3.2 mm and 6 mm.

14. The manufacturing method claim 1, further comprising introducing the sensor into the housing body of the sensor housing.

15. The manufacturing method claim 1, further comprising:

introducing the sensor into the sensor housing;

introducing the housing body of the sensor housing into the process inlet such that the first sealing section seats against the process seal;

applying the clamping element to the sensor housing such that the clamping contact area of the clamping element seats against the collar contact area of the housing collar as to press the housing collar against the process seal of the process inlet; and applying the fixing element to the clamping element such that the sensor housing is connected to the process inlet via the housing collar in a reversible, fluid-tight manner.

\* \* \* \* \*